United States Patent
Iriguchi

(10) Patent No.: US 8,199,040 B2
(45) Date of Patent: Jun. 12, 2012

(54) ANALOG-TO-DIGITAL CONVERTER

(75) Inventor: Masao Iriguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/069,958

(22) Filed: Mar. 23, 2011

(65) Prior Publication Data

US 2011/0169676 A1 Jul. 14, 2011

Related U.S. Application Data

(63) Continuation of application No. 12/549,034, filed on Aug. 27, 2009, now Pat. No. 7,924,192.

(30) Foreign Application Priority Data

Aug. 27, 2008 (JP) .................................. 2008-217714

(51) Int. Cl.
*H03M 3/00* (2006.01)
(52) U.S. Cl. ........................................ 341/143; 341/155
(58) Field of Classification Search .................. 341/143, 341/155
See application file for complete search history.

(56) References Cited

U.S. PATENT DOCUMENTS

| | | | | |
|---|---|---|---|---|
| 2005/0231411 A1* | 10/2005 | Wu et al. | ........................ | 341/143 |
| 2006/0261993 A1* | 11/2006 | Chen | ............................. | 341/155 |
| 2007/0290914 A1* | 12/2007 | Matsushita et al. | ........... | 341/155 |
| 2011/0063155 A1* | 3/2011 | Chen et al. | ..................... | 341/143 |

FOREIGN PATENT DOCUMENTS

| | | |
|---|---|---|
| JP | 9205369 | 8/1997 |
| WO | WO 9625800 | 8/1996 |

* cited by examiner

*Primary Examiner* — Howard Williams
(74) *Attorney, Agent, or Firm* — Young & Thompson

(57) ABSTRACT

A $\Delta\Sigma$ analog-to-digital converter includes a previous stage amplifier circuit which amplifies an input signal, a conversion circuit which converts an analog signal into a digital signal, where the analog signal is output from the previous stage amplifier circuit, an input node provided in the previous stage amplifier circuit, a plurality of capacitors provided in the conversion circuit, a first amplifier and a second amplifier, and a path switching circuit which connects the first amplifier to the input node in a first mode and connects the first amplifier to the plurality of capacitors in a second mode, where the first mode is for sampling the analog signal and the second mode is for performing an integration operation. The first amplifier forms the previous stage amplifier circuit in the first mode, and forms an integrator which carries out the integration operation performed in the conversion circuit in the second mode.

11 Claims, 6 Drawing Sheets

ANALOG-TO-DIGITAL CONVERTER

BACKGROUND

1. Field of the Invention

The present invention relates to a ΔΣ analog-to-digital converter, and particularly to a ΔΣ analog-to-digital converter separately provided with an amplifier in the previous stage of a conversion circuit.

2. Description of Related Art

Along with the progress of the digital circuit technology, input analog signals are becoming to be processed by digital circuits. In such case, the input analog signals must be converted into digital signals. Therefore, there are many analog-to-digital converters suggested. One of the analog-to-digital converters is a ΔΣ analog-to-digital converter. The ΔΣ analog-to-digital converter has a characteristic of an excellent noise shaping ability to reduce a noise component overlapped to an analog signal. The noise shaping ability of the ΔΣ analog-to-digital converter improves by an order.

The ΔΣ analog-to-digital converter is formed of multiple stages of integrator circuits, where the integrator circuit is formed of a capacitor and an amplifier. The number of the stages is determined by the order of the ΔΣ analog-to-digital converter. Further, the number of the amplifiers and capacitors in the ΔΣ analog-to-digital converter increases in proportion to the order. Therefore, there is a problem in the ΔΣ analog-to-digital converter that the circuit size increases according to the order. An example of the technique to suppress the circuit size of the ΔΣ analog-to-digital converter is disclosed in Japanese Unexamined Patent Application Publication No. 9-205369 and Domestic Re-publication of PCT International Publication for Patent Application, No. WO 96/25800.

The ΔΣ analog-to-digital converters disclosed in Japanese Unexamined Patent Application Publication No. 9-205369 and Domestic Re-publication of PCT International Publication for Patent Application, No. WO 96/25800 have multiple capacitors connected in parallel to a feedback path of one amplifier. Then, the multiple capacitors are switched in a time-sharing manner to perform an integration operation. That is, the ΔΣ analog-to-digital converter disclosed in Japanese Unexamined Patent Application Publication No. 9-205369 and Domestic Re-publication of PCT International Publication for Patent Application, No. WO 96/25800 forms a converter by a smaller number of amplifiers than the order. This enables to reduce the circuit area and power consumption for the amplifiers.

SUMMARY

However the present inventor has found a problem that in the ΔΣ analog-to-digital converter disclosed in Japanese Unexamined Patent Application Publication No. 9-205369 and Domestic Re-publication of PCT International Publication for Patent Application, No. WO 96/25800, that as the capacitors are switched in a time-sharing manner to perform an integration operation, a conversion process for the next input signal cannot be started until a conversion process for an input signal sampled at a certain sampling timing is completed. In order to reduce the time taken for the conversion process, the amplifiers must be operated at high speed. The power consumption of the amplifiers must be increased to operate the amplifiers at high speed. Therefore, to improve the conversion ability of the ΔΣ analog-to-digital converter of the related arts, the amplifiers must be operated with more power consumption. Thus, there is a problem in the ΔΣ analog-to-digital converter of the related arts that the power consumption cannot be sufficiently reduced.

An exemplary aspect of an embodiment of the present invention is a ΔΣ analog-to-digital converter that includes a previous stage amplifier circuit which amplifies an input signal, a conversion circuit which converts an analog signal into a digital signal, where the analog signal is output from the previous stage amplifier circuit, an input node provided in the previous stage amplifier circuit, a plurality of capacitors provided in the conversion circuit, a first amplifier and a second amplifier provided in the conversion circuit, and a path switching circuit which connects the first amplifier to the input node in a first mode and connects the first amplifier to the plurality of capacitors in a second mode, where the first mode is for sampling the analog signal and the second mode is for performing an integration operation. The first amplifier forms the previous stage amplifier circuit in the first mode, and forms an integrator which carries out the integration operation performed in the conversion circuit in the second mode. Thus the ΔΣ analog-to-digital converter according to the present invention enables to form a conversion circuit by a smaller number of second amplifiers than the order.

The ΔΣ analog-to-digital converter of the present invention achieves a ΔΣ analog-to-digital converter with reduced power consumption.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
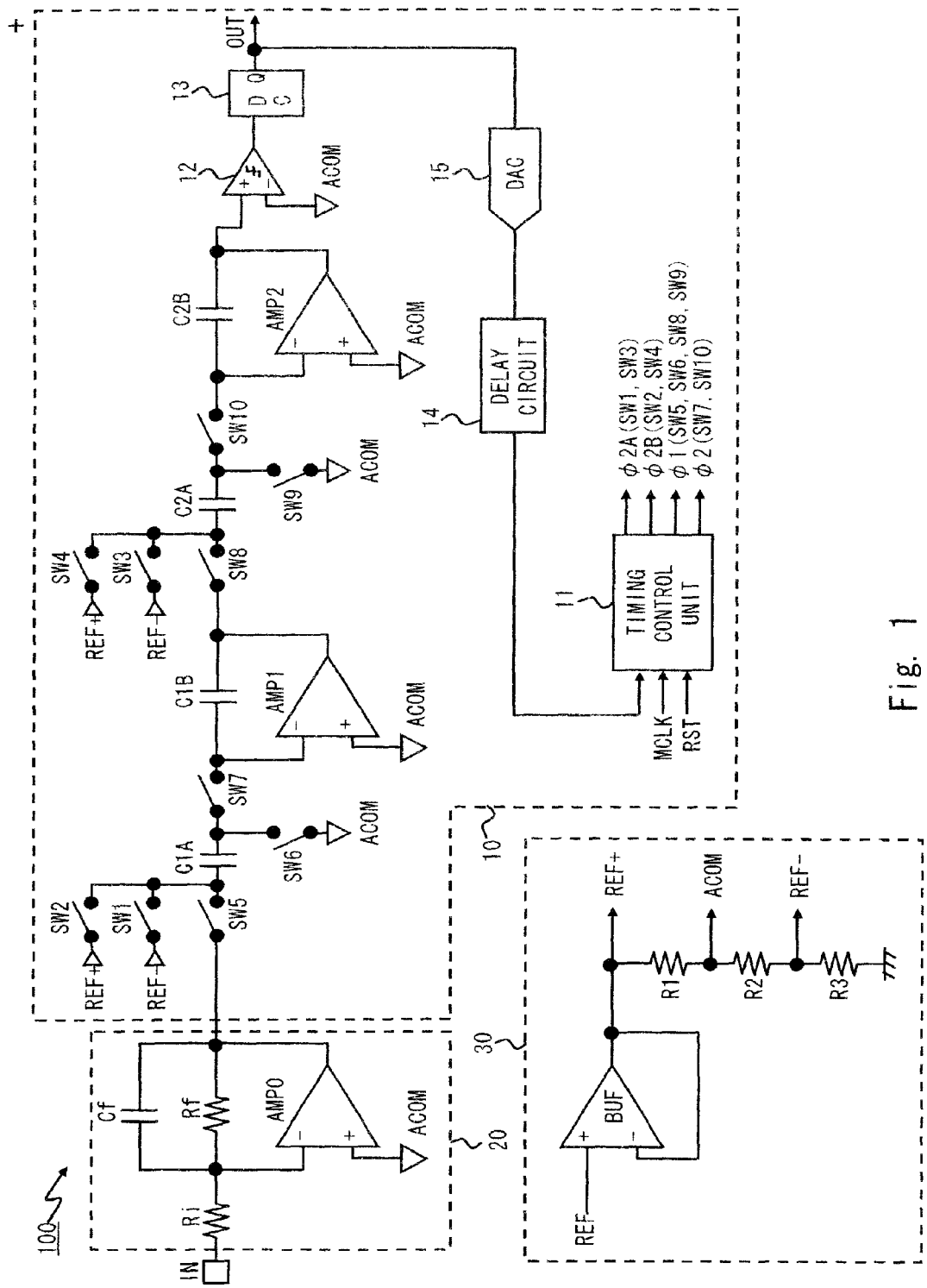
FIG. 1 is a block diagram of a ΔΣ analog-to-digital converter which will be the based on for a ΔΣ analog-to-digital converter according to a first exemplary embodiment.

Hereinafter, an exemplary embodiment of the present invention is described with reference to the drawings. FIG. 1 is a block diagram of a ΔΣ analog-to-digital converter 100 to be based on for a ΔΣ analog-to-digital converter of this exemplary embodiment. In this exemplary embodiment, a second order ΔΣ analog-to-digital converter is explained, however the present invention is not particularly limited to the second order. As shown in FIG. 1, the ΔΣ analog-to-digital converter 100 includes a conversion circuit 10, a previous stage amplifier circuit 20, and a reference voltage generation circuit 30.

The conversion circuit 10 samples an input signal, performs an integration operation, and outputs a ΔΣ code signal OUT according to the input signal. The conversion circuit 10 includes amplifiers AMP1 and AMP2, switches SW1 to SW10, a first capacitor C1A, a second capacitor C1B, a third capacitor C2A, a fourth capacitor C2B, a quantizer 12, a latch circuit 13, a timing control unit 11, a digital-to-analog conversion circuit 15, and a delay circuit 14. Note that the amplifier AMP2 is excluded in a ΔΣ analog-to-digital converter according to an exemplary embodiment described later.

In the conversion circuit 10, an input signal is provided to one terminal of the switch SW5 via the previous stage amplifier circuit 20. One terminal of the first capacitor C1A is connected to the other terminal of the switch SW5. Further, a first reference voltage REF− or a second reference voltage REF+ is provided to a junction between the switch SW5 and the first capacitor C1A via the switches SW1 and SW2. The first reference voltage REF− and the second reference voltage REF+ are selectively provided to the first capacitor C1A according to the switching condition of the switches SW1 and SW2. The other terminal of the first capacitor C1A is connected to one terminal of the switch SW7. The other terminal of the first capacitor C1A is connected to a reference voltage node to which a reference voltage ACOM is supplied via the switch SW6. The details of the first reference voltage REF−, the second reference voltage REF+, and the reference voltage ACOM are described later.

One terminal of the second capacitor C1B is connected to the other terminal of the switch SW7. One terminal of the switch SW8 is connected to the other terminal of the second capacitor C1B. One terminal of the second capacitor C1B is connected to a negative input terminal of the amplifier AMP1, and the other terminal is connected to an output terminal of the amplifier AMP1. A positive input terminal of the amplifier AMP1 is connected to the reference voltage node, and the reference voltage ACOM is supplied to the amplifier AMP1.

One terminal of the third capacitor C2A is connected to the other terminal of the switch SW8. Further, the first reference voltage REF− or the second reference voltage REF+ is provided to the junction between the switch SW8 and the third capacitor C2A via the switches SW3 and SW4. The first reference voltage REF− and the second reference voltage REF+ are selectively provided to the third capacitor C2A according to the switching condition of the switches SW3 and SW4. The other terminal of the third capacitor C2A is connected to one terminal of the switch SW10. The other terminal of the third capacitor C2A is connected to the reference voltage node to which the reference voltage ACOM is supplied via the switch SW9. The other terminal of the switch SW10 is connected to one terminal of the fourth capacitor C2B. A positive input terminal of the quantizer 12 is connected to the other terminal of the fourth capacitor C2B. Further, one terminal of the fourth capacitor C2B is connected to a negative input terminal of the amplifier AMP2, and other terminal is connected to an output terminal of the amplifier AMP2. A positive input terminal of the amplifier AMP2 is connected to the reference voltage node, and the reference voltage ACOM is supplied to the amplifier AMP2.

A negative input terminal of the quantizer 12 is connected to the reference voltage node. An output of the quantizer 12 is connected to an input terminal D of the latch circuit 13. The quantizer 12 synchronizes with a clock signal received from other circuit not illustrated and outputs the ΔΣ code signal OUT. The latch circuit 13 is for example a D flip-flop, and outputs the ΔΣ code signal OUT from an output terminal Q.

The digital-to-analog conversion circuit 15 converts the ΔΣ code signal OUT into an analog value to output. Then, the delay circuit 14 delays the signal output from the digital-to-analog conversion circuit 15 to be input to the timing control unit 11.

The timing control unit 11 outputs feedback control signals φ2A and φ2B according to the signal input via the delay circuit 14. The feedback control signals φ2A and φ2B are in exclusive relationship with a timing control signal φ1, which is described later, and is in synchronous relationship with a timing control signal φ2. The feedback control signal φ2A is provided to the switches SW1 and SW3. The feedback control signal φ2B is provided to the switches SW2 and SW4. The feedback control signals φ2A and φ2B are exclusively controlled so that negative feedback control is performed to the amplifier AMP1 and AMP2 according to the value of the ΔΣ code signal OUT. The switching condition of the switches SW1 to SW4 is controlled by the feedback control signals φ2A and φ2B. Note that the switching conditions of the switches SW1 and SW3, and switches SW2 and SW4 are exclusively controlled from each other.

Further, the timing control unit 11 outputs the timing signals φ1 and φ2 in response to a clock signal MCLK and a reset signal RST received from other circuit which is not illustrated. The timing signal φ1 is provided to the switches SW5, SW6, SW8, and SW9. The timing signal φ1 is provided to the switch SW7. The switching condition of the switches SW5, SW6, SW8, and SW9, and the switching condition of the switch SW7 are controlled exclusively from each other.

In this exemplary embodiment, the previous stage amplifier circuit 20 forms a filter circuit including an amplifier. The previous stage amplifier circuit 20 includes an amplifier AMP0, resistors Ri and Rf, and a capacitor Cf. One terminal of the resistor Ri is connected to an external input terminal IN. The other terminal of the resistor Ri is connected to one terminal of the resistor Rf. One terminal of the resistor Rf is connected to a negative input terminal of the amplifier AMP0. The other terminal of the resistor Rf is connected to an output terminal of the amplifier AMP0. The capacitor Cf is connected to the resistor Rf in parallel. A positive input terminal of the amplifier AMP0 is connected to a reference voltage node. That is, in the previous stage amplifier circuit 20, a gain is determined by a resistance ratio between the resistors Ri and Rf, and forms a filter circuit with a cutoff frequency determined by the resistances Rf and the capacitor Cf. The amplifier AMP0 enables to keep constant an input impedance from the external input terminal regardless of the resistance value of the resistor Rf.

Further, as the previous stage amplifier circuit 20 is provided in the previous stage of the conversion circuit 10, high-frequency noise can be removed from analog signals, which are converted into digital signals by the conversion circuit 10. In the ΔΣ analog-to-digital converter, high-frequency noise turns into aliasing noise that causes to generate a large error in the conversion result. Therefore, in the ΔΣ analog-to-digital converter, by providing a low-pass filter as the previous stage amplifier circuit, higher conversion accuracy can be achieved even with a low order configuration.

The reference voltage generation circuit 30 includes a buffer circuit BUF and resistors R1 to R3. The resistors R1 to R3 are connected in series between an output of the buffer circuit BUF and a ground terminal. The buffer circuit BUF outputs a reference voltage REF, generated in other circuit which is not illustrated, as the second reference voltage REF+. Further, the reference voltage generation circuit 30 divides the second reference voltage REF+ using the resistors R1 to R3 to generate the reference voltage ACOM and the first reference voltage REF−. The line for transmitting the reference voltage ACOM is hereinafter referred to as a reference voltage node.

Figure 2:
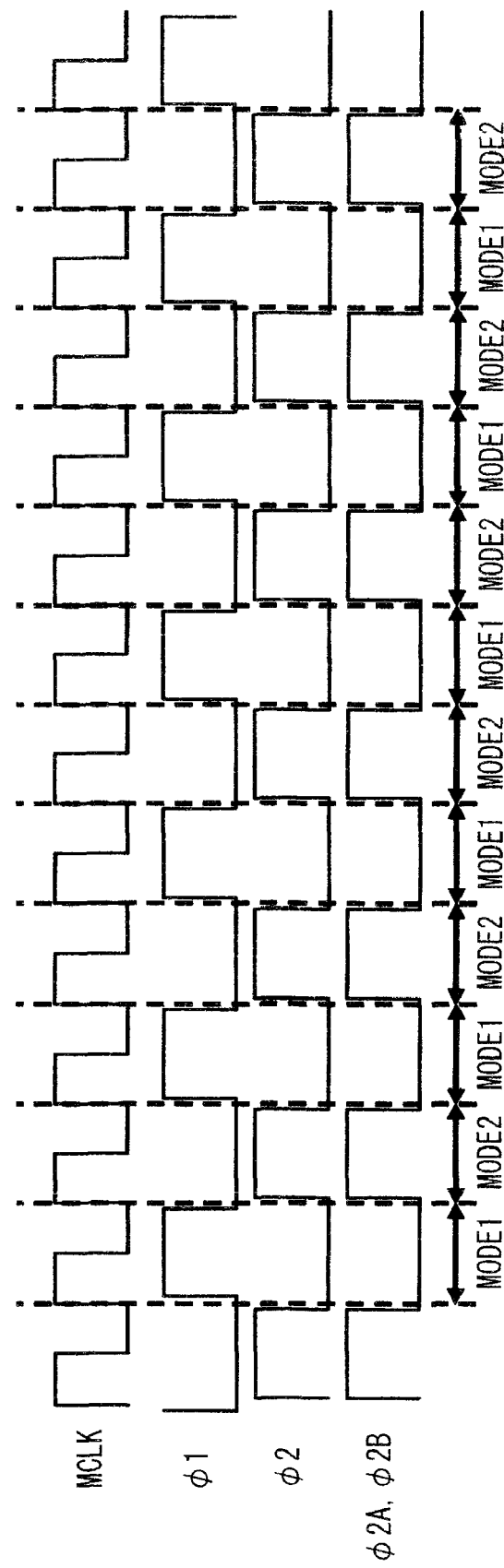
FIG. 2 is a waveform chart of timing signals in the ΔΣ analog-to-digital converter illustrated in FIG. 1.

An operation of the ΔΣ analog-to-digital converter 100 is explained hereinafter. FIG. 2 is a waveform chart of the feedback control signals φ2A and φ2B and the timing signals φ1 and φ2 generated by the timing control unit 11. As shown in FIG. 2, the timing signals φ1 and φ2 are generated by dividing the clock signal MCLK. The timing signals φ1 and φ2 are mutually inverted. There is dead time in which logical levels of both timing signals φ1 and φ2 are low-level. This dead time is a period provided to accurately perform a charge transfer between the capacitors of the conversion circuit 10. In this exemplary embodiment, the feedback control signals φ2A and φ2B are synchronous with the timing signal φ1. In FIG. 2, the feedback control signals φ2A and φ2B are illustrated as one signal, however they originally are individual signals. That is, the waveform of the feedback control signals φ2A and φ2B in FIG. 2 is a composite waveform of the two signals.

The ΔΣ analog-to-digital converter 100 has two operational modes by the timing signals φ1 and φ2, which are a first mode MODE1 and a second mode MODE2. In this exemplary embodiment, the period in which the timing signal φ1 is high-level and the timing signal φ2 is low-level is referred to as the first mode MODE1. Further, the period in which the timing signal φ1 is low-level and the timing signal φ2 is high-level is referred to as the second mode MODE2.

In the first mode MODE1, the switches SW5, SW6, SW8 and SW9 are conductive and the switches SW7 and SW10 are blocked. In the first mode MODE1, the conversion circuit 10 samples the input signal input into the first capacitor C1A via the previous stage amplifier circuit 20. As for the amplifier AMP1, the second capacitor C1B is connected between the output terminal and the negative terminal, and the third capacitor C2A is connected between the output terminal and the reference voltage node. Therefore, the integration result of the previous cycle, which is saved to the second capacitor C1B, is sampled by the third capacitor C2A. As for the amplifier AMP2, the fourth capacitor C2B is connected between the output terminal and the negative input terminal, and an input terminal is connected to the reference voltage node. Then, the quantizer 12 outputs the ΔΣ code signal according to the integration result of the previous cycle, which is saved to the fourth capacitor C2B.

In the second mode MODE2, the switches SW5, SW6, SW8, and SW9 are blocked, and the switches SW7 and SW10 are conductive. In the second mode MODE2, either the switches SW1 and SW3 or the switches SW2 and SW4 are conductive. Therefore, in the second mode MODE2, the first reference voltage REF− or the second reference voltage REF+ is provided to the input terminal of the amplifier AMP1 via the first capacitor C1A. Further, the second capacitor C1B is connected between the negative input terminal and the output terminal of the amplifier AMP1. The first reference voltage REF− or the second reference voltage REF+ is provided to the input terminal of the amplifier AMP1 via the third capacitor C2A. The fourth capacitor C2B is connected between the negative input terminal and the output terminal of the amplifier AMP2. That is, the amplifiers AMP1 and AMP2 constitute an integrator in the second mode MODE2. Then, the integrator integrates a difference voltage obtained from the integration result last time and a difference voltage with the reference voltage, which is provided according to the ΔΣ code signal.

In the ΔΣ analog-to-digital converter explained above, two amplifiers are mounted in the conversion circuit 10 to achieve second order conversion process. However, in the ΔΣ analog-to-digital converter of this exemplary embodiment, one of the amplifiers is removed from the conversion circuit 10. A path switching circuit 40 is provided instead. The amplifier AMP0 in the previous stage amplifier circuit 20 is used in the conversion circuit in the second mode MODE2 by the path switching circuit 40.

Figure 3:
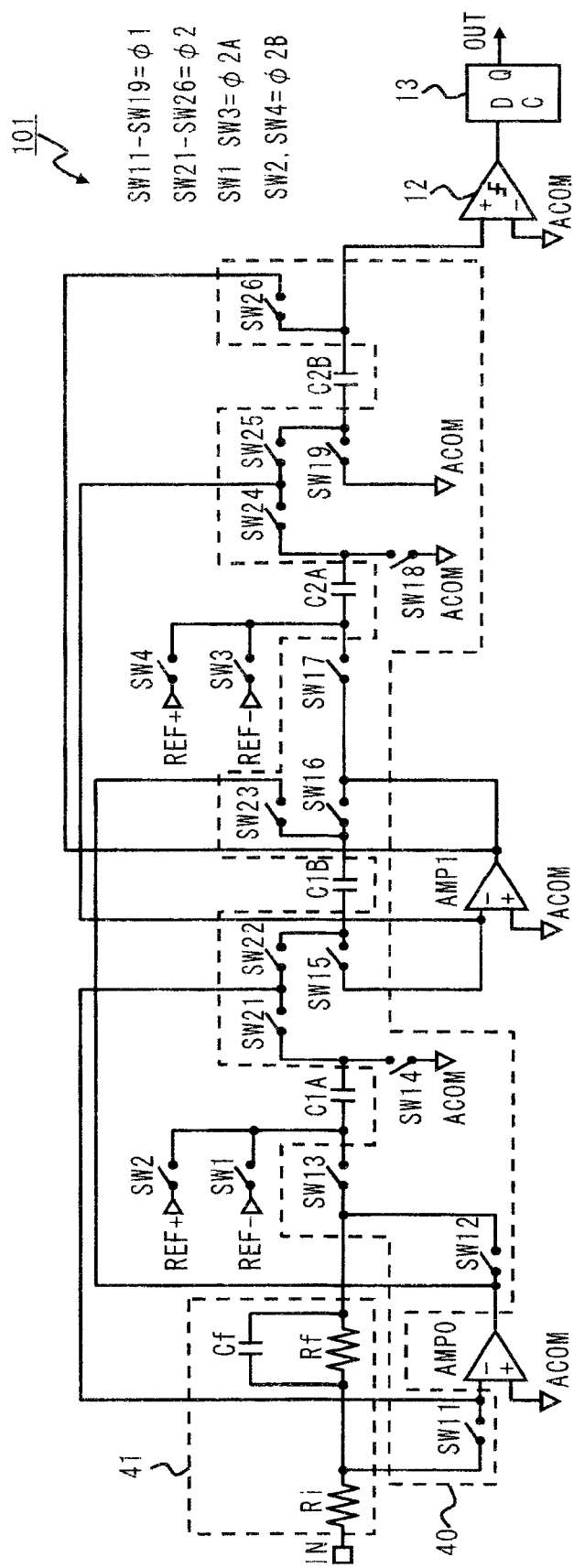
FIG. 3 is a block diagram of the ΔΣ analog-to-digital converter according to the first exemplary embodiment.

FIG. 3 is a block diagram illustrating a ΔΣ analog-to-digital converter 101 according to this exemplary embodiment. In the ΔΣ analog-to-digital converter 101, the same components as the ΔΣ analog-to-digital converter 100 are denoted by the same signs thereof and the explanation is omitted. The timing control unit 11, the delay circuit 14, the digital-to-analog conversion circuit 15, and the reference voltage generation circuit 30 are not illustrated in the drawing and the explanation thereof is omitted.

As shown in FIG. 3, the ΔΣ analog-to-digital converter 101 includes a first amplifier (for example, amplifier AMP0), a second amplifier (amplifier AMP1), the path switching circuit 40, an input node 41, a first capacitor C1A, a second capacitor C1B, a third capacitor C2A, and a fourth capacitor C2B. Note that in this exemplary embodiment, the amplifiers AMP0 and AMP1 are single-ended output amplifiers.

In the ΔΣ analog-to-digital converter 100, the input node 41 is for separately providing the resistors Ri and Rf, and the capacitor Cf in the previous stage amplifier circuit 20 from the amplifier AMP0. Further, in the ΔΣ analog-to-digital converter 101, the first capacitor C1A, the second capacitor C1B, the third capacitor C2A, and the fourth capacitor C2B are separated from the amplifiers AMP0 and AMP1. The path switching circuit 40 is provided between the amplifiers AMP0 and AMP1, the input node 41, the first capacitor C1A, the second capacitor C1B, the third capacitor C2A, and the fourth capacitor C2B. Then, the path switching circuit 40 switches which device to connect to the amplifiers AMP0 and AMP1 in the first mode MODE1 and the second mode MODE2.

The path switching circuit 40 is described in further detail hereinafter. The path switching circuit 40 includes switches SW11 to SW19 and switches SW21 to SW26. In the first mode MODE1 (when the timing signal φ1 is high-level), the switches SW11 to SW19 become conductive. In the second mode MODE2 (when the signal φ2 is high-level), the switches SW21 to SW26 become conductive.

The switch SW11 is provided between one terminal of the resistor Rf of the input node 41 and the negative input terminal of the amplifier AMP0. The switch SW12 is provided between the other terminal of the resistor Rf of the input node 41 and the output terminal of the amplifier AMP0. The switch SW13 is provided between the other terminal of the resistor Rf and one terminal of the first capacitor C1A. The switch SW14 is provided between the other terminal of the first capacitor C1A and the reference voltage node. The switch SW15 is provided between one terminal of the second capacitor C1B and the negative input terminal of the amplifier AMP1. The switch SW16 is provided between the terminal of the second capacitor C1B and the output terminal of the amplifier AMP1. The switch SW17 is provided between the output terminal of the amplifier AMP1 and one terminal of the third capacitor C2A. The switch SW18 is provided between the other terminal of the third capacitor C2A and the reference voltage node. The switch SW19 is provided between the one terminal of the fourth capacitor C2B and the reference voltage node.

The switch SW21 is provided between the other terminal of the first capacitor CIA and the negative input terminal of the amplifier AMP0. The switch SW22 is provided between the negative input terminal of the amplifier AMP0 and one terminal of the second capacitor C1B. The switch SW23 is provided between the other terminal of the second capacitor C1B and the output terminal of the amplifier AMP0. The switch SW24 is provided between the other terminal of the third capacitor C2A and the negative input terminal of the amplifier AMP1. The switch SW25 is provided between the negative input terminal of the amplifier AMP1 and one terminal of the fourth capacitor C2B. The switch SW26 is provided between the other terminal of fourth capacitor C2B and the output terminal of the amplifier AMP1.

An operation of the ΔΣ analog-to-digital converter 101 according to this exemplary embodiment is explained hereinafter. The ΔΣ analog-to-digital converter 101 also performs operations while switching the two modes using the timing signals φ1 and φ2. In the ΔΣ analog-to-digital converter 101, the path switching circuit 40 switches a connection of the amplifiers AMP0 and AMP1 to the input node 41 and the capacitors according to the mode. The connection of the circuit in each mode of the ΔΣ analog-to-digital converter 101 is explained hereinafter.

Figure 4:
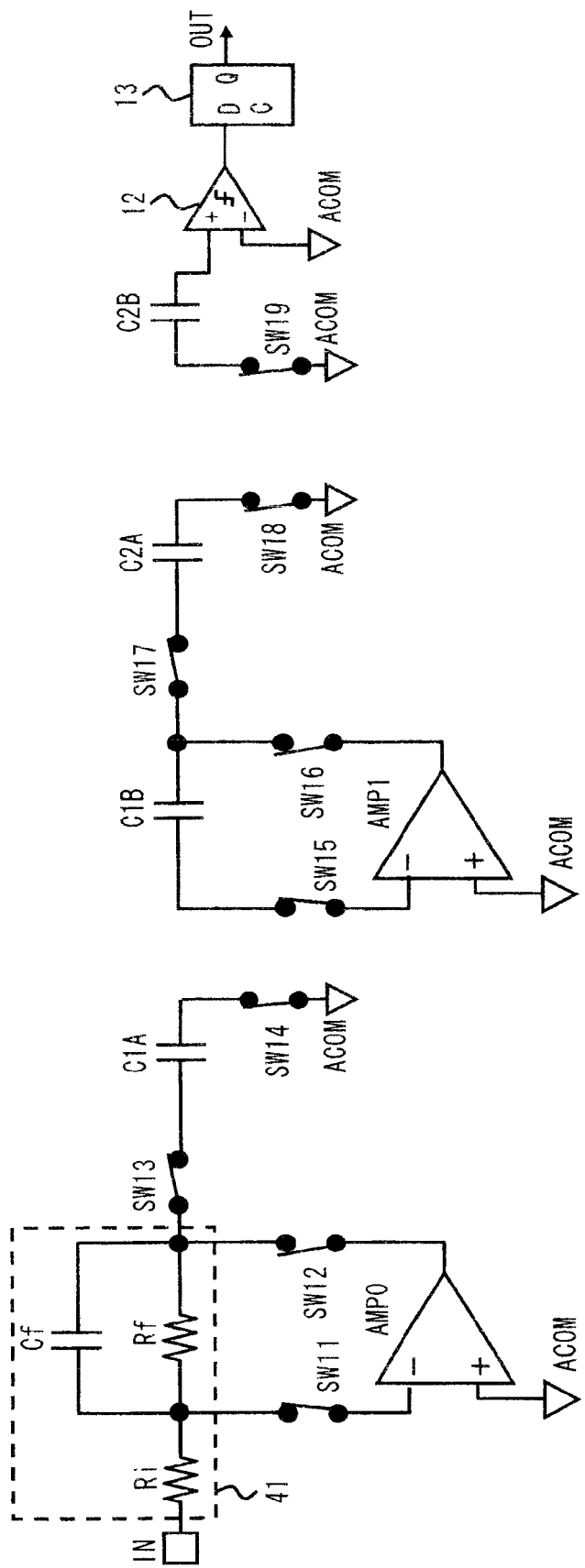
FIG. 4 is a block diagram illustrating the connection configuration of the ΔΣ analog-to-digital converter in the first mode according to the first exemplary embodiment.

The connection state of the ΔΣ analog-to-digital converter 101 in the first mode MODE1 is illustrated in FIG. 4. As shown in FIG. 4, in the first mode MODE1, the switches SW11 to SW19 are conductive, and the switches SW21 to SW26 are blocked. Then, one terminal of the resistor Ri is connected to the external input terminal IN. The other terminal of the resistor Ri is connected to the negative input terminal of the amplifier AMP0. One terminal of the resistor Rf is connected to the negative input terminal of the amplifier AMP0. The other terminal of the resistor Rf is connected to the output terminal of the amplifier AMP0, and one terminal of the first capacitor C1A. The capacitor Cf is connected to the resistor Rf in parallel. The other terminal of the first capacitor C1A is connected to the reference voltage node. That is, in the first mode MODE1, the amplifier AMP0 forms a low-pass filter circuit and provides a filtered input signal to the first capacitor C1A. Then, the input signal is sampled by the first capacitor C1A.

The second capacitor C1B is connected between the negative input terminal and the output terminal of the amplifier AMP1. The third capacitor C2A is connected between the output terminal of the amplifier AMP1 and the reference voltage node. At this time, the first order integration result calculated in the previous second mode MODE2 is saved to the second capacitor C1B. Then, the integration result saved to the second capacitor C1B is sampled by the third capacitor C2A.

The fourth capacitor C2B is connected between the negative input terminal of the quantizer 12 and the reference voltage node. At this time, the second order integration result calculated in the previous second mode MODE2 is saved to the fourth capacitor C2B. Then, the quantizer 12 quantizes the second order integrated result saved in the fourth capacitor C2B and outputs the ΔΣ code signal.

Figure 5:
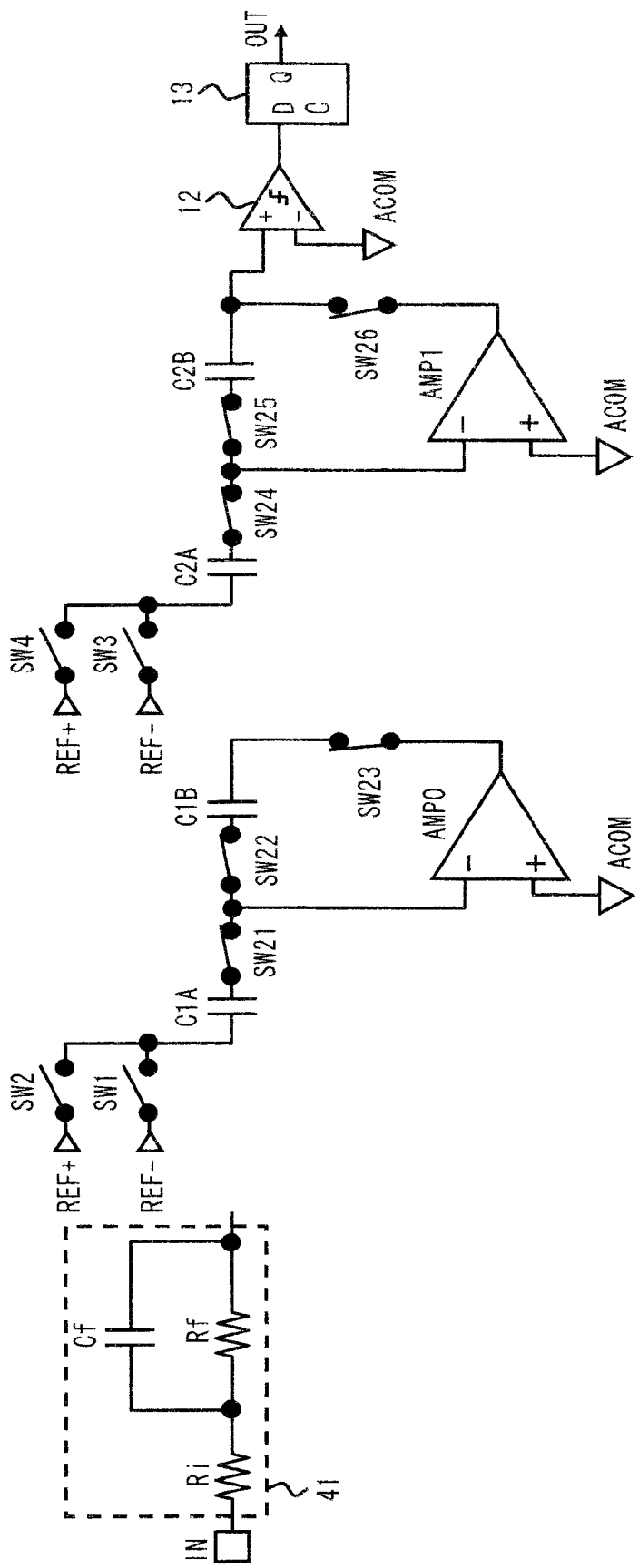
FIG. 5 is a block diagram illustrating the connection configuration of the ΔΣ analog-to-digital converter in the second mode according to the first exemplary embodiment.

Next, the connection state of the ΔΣ analog-to-digital converter 101 in the second mode MODE2 is illustrated in FIG. 5. As shown in FIG. 5, in the second mode MODE2, the input node 41 is separated from the first capacitor C1A and the amplifier AMP0.

On the other hand, the amplifier AMP0 is connected to the capacitors in the conversion circuit. The second capacitor C1B is connected between the negative input terminal and the output terminal of the amplifier AMP0. Further, the other terminal of the first capacitor C1A is connected to the negative input terminal of the amplifier AMP0. Then, in second mode MODE2, the first reference voltage REF− or the second reference voltage REF+ is provided to one terminal of the first capacitor C1A according to the ΔΣ code signal output in the previous second mode MODE2. That is, in the second mode MODE2, the amplifier AMP0 forms one of integrators in the conversion circuit. The amplifier AMP0 integrates a difference between the sampled differential signal and the provided reference voltage, and holds the integration result in the second capacitor C1B.

The fourth capacitor C2B is connected between the negative input terminal and the output terminal of the amplifier AMP1. The other terminal of the third capacitor C2A is connected to the negative input terminal of the amplifier AMP1. Then, in second mode MODE2, the first reference voltage REF− or the second reference voltage REF+ is provided to one terminal of the third capacitor C2A according to the ΔΣ code signal output in the previous second mode MODE2. That is, in the second mode MODE2, the amplifier AMP1 forms one of integrators in the conversion circuit. The amplifier AMP1 integrates a difference between the sampled differential signal and the provided reference voltage, and holds the integration result in the fourth capacitor C2B.

From the above explanation, in the ΔΣ analog-to-digital converter 101 according to this exemplary embodiment, one amplifier is included in the conversion circuit when forming the second order ΔΣ analog-to-digital converter. Then, in the operation of the second mode MODE2 to perform an integration operation, the amplifier AMP0 in the previous stage amplifier circuit is moved to the conversion circuit, and two integrators are realized by the moved amplifier AMP0 and the amplifier AMP1 provided originally in the conversion circuit. That is, the ΔΣ analog-to-digital converter 101 of this exemplary embodiment realizes a ΔΣ analog-to-digital converter with a order higher than the number of amplifiers. Accordingly, the ΔΣ analog-to-digital converter 101 of this exemplary embodiment enables to reduce the power consumption of the amplifiers and also the circuit area.

Particularly in the use of sound processing, the conversion accuracy can be improved by providing the previous stage amplifier circuit. However, in the second mode to perform an integration operation, the amplifier of the previous stage amplifier circuit does not especially influence the operation of the entire circuit. Therefore, in the ΔΣ analog-to-digital converter 101 according to this exemplary embodiment, the amplifier, which is provided in the previous stage amplifier circuit having unused period, is used in the conversion circuit in the unused period, so as to reduce the number of amplifiers in the conversion circuit. Thus the ΔΣ analog-to-digital converter 101 of this exemplary embodiment enables to simply reduce the circuit area and power consumption.

Further, in the ΔΣ analog-to-digital converter of this exemplary embodiment, it is not necessary to multiplex the capacitors in the integration operation performed in the second mode MODE2, the capacitors need not to be switched in a time-sharing manner. Accordingly, the amplifier which forms an integrator in the conversion circuit is not required for high-speed operations. The ΔΣ analog-to-digital converter 101 of this exemplary embodiment enables to operate the amplifier to form the integrator at low power consumption. The ΔΣ analog-to-digital converter of this exemplary embodiment enables to reduce the power consumption of the whole circuit. In other words, it is possible to achieve the reduction effect of the power consumption by reducing the number of circuits, without increasing the power consumption of the amplifiers.

In the ΔΣ analog-to-digital converter, the latter the stage where the amplifiers are placed, the smaller current capability is required. On the other hand, the amplifier AMP0 in the previous stage amplifier circuit has a large current capability to drive the first stage capacitor for sampling in the conversion circuit. Therefore, the reduction effect of the circuit area is higher when using the amplifier AMP0 in the previous stage amplifier circuit as a first stage integrator in the conversion circuit. There is no limitation in allocating the amplifier of the previous stage amplifier circuit to any integrator in the conversion circuit according to the configuration of the conversion circuit.

Further, in the abovementioned exemplary embodiment, the previous stage amplifier circuit 20 is used to form the low-pass filter. However the filter circuit is not necessary in the use with little noise in an input signal, but the previous stage amplifier circuit may only be an amplifier circuit for amplifying the input signal. In such case, the capacitor Cf in the previous stage amplifier circuit may be eliminated. Further, an AGC (Auto Gain Control) circuit with a variable gain may be used as the previous stage amplifier circuit to uniform amplitudes of input signals. The AGC circuit enables to keep constant the amplitudes of the input signals to be sampled regardless of the amplitudes of the input signals. The resistance value of the resistor Rf in the previous stage amplifier circuit may be varied according to the amplitude of the output signal to change the gain.

Second Exemplary Embodiment

Figure 6:
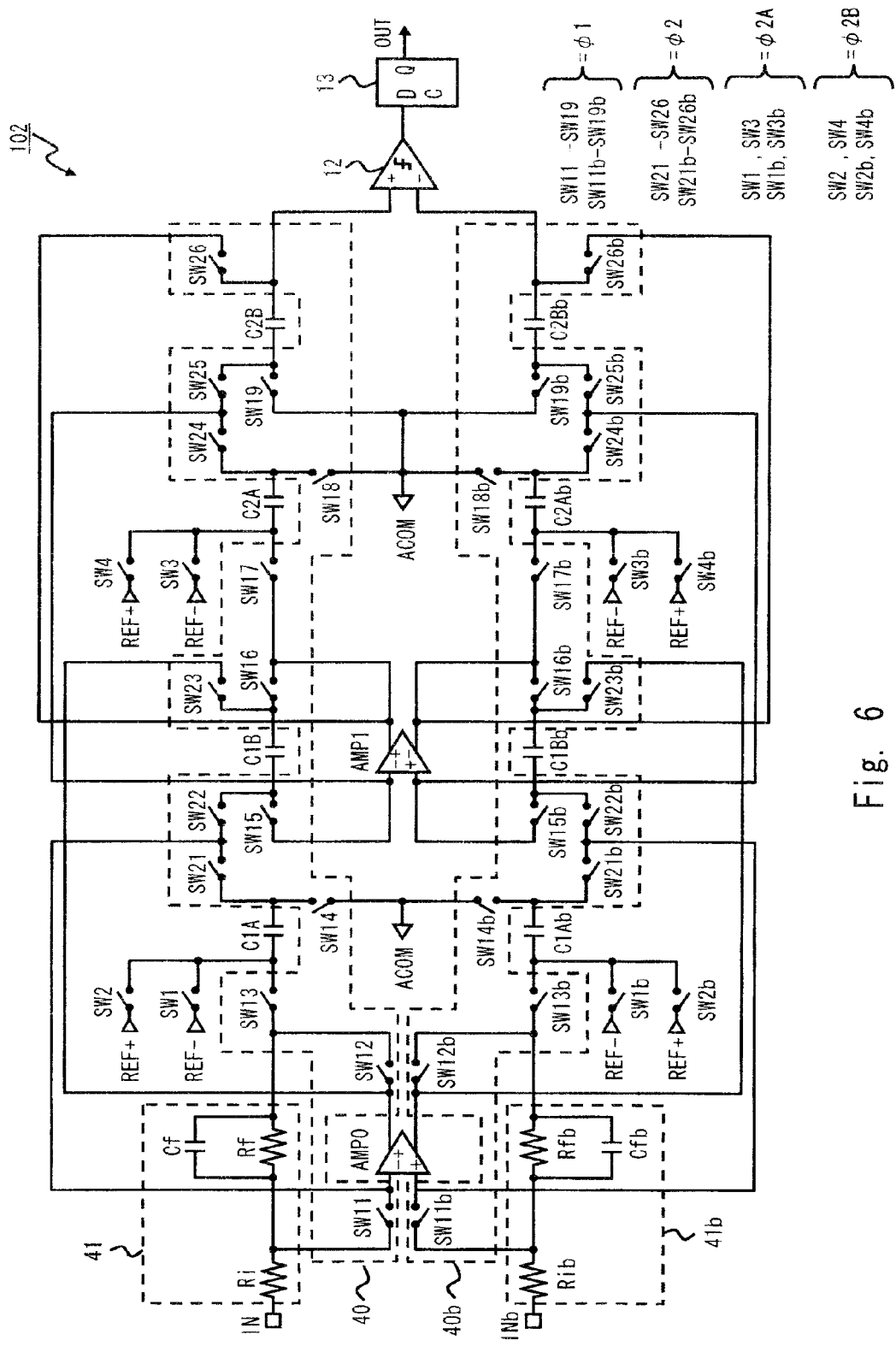
FIG. 6 is a block diagram of a ΔΣ analog-to-digital converter according to a second exemplary embodiment.

A block diagram of a ΔΣ analog-to-digital converter 102 according to a second exemplary embodiment is illustrated in FIG. 6. As shown in FIG. 6, the ΔΣ analog-to-digital converter 102 is the ΔΣ analog-to-digital converter 101 explained in the first exemplary embodiment that corresponds to a differential input signal. That is, the ΔΣ analog-to-digital converter 102 uses fully differential amplifiers as amplifiers AMP0 and AMP1.

As shown in FIG. 6, to the positive input terminal side of the amplifier, the ΔΣ analog-to-digital converter 102 is provided with the path switching circuit 40, the input node 41, the first capacitor C1A, the second capacitor C1B, the third capacitor C2A, and the fourth capacitor C2B, so as to correspond with one of differential signals. To the negative input terminal side of the amplifier, the ΔΣ analog-to-digital converter 102 is provided with a path switching circuit 40b, an input node 41b, a first capacitor C1Ab, a second capacitor C1Bb, a third capacitor C2Ab, and a fourth capacitor C2Bb, so as to correspond with another differential signal.

The path switching circuit 40b, the input node 41b, the first capacitor C1Ab, the second capacitor C1Bb, the third capacitor C2Ab, and the fourth capacitor C2Bb are practically the same as the path switching circuit 40, the input node 41, the first capacitor C1A, the second capacitor C1B, the third capacitor C2A, and fourth capacitor C2B, respectively. In the drawings, the same signs are marked to the resistors and capacitors, and the components placed in the path corresponding to the other differential signal are denoted with "b" appended to the signs. Therefore, the explanation is omitted here. The capacitors provided in the negative input terminal side of the amplifier are same capacity and same shape as the capacitors provided to the positive input terminal side. The switches in the path switching circuit 40b of the amplifier are controlled by a timing signal in-phase with the corresponding switches in the path switching circuit 40.

Thus, an in-phase noise component can be removed by corresponding to the input of a differential signal. Accordingly, the ΔΣ analog-to-digital converter 102 enables to improve the noise immunity in the conversion processes. The ΔΣ analog-to-digital converter 102 is also effective as with the ΔΣ analog-to-digital converter 101 to reduce the power consumption and the circuit size.

The present invention is not limited to the above exemplary embodiments but may be modified appropriately within the scope of the present invention. For example, the configuration of the path switching circuit is not limited to the one in the above exemplary embodiments, as long as achieving the connection configuration in which the amplifiers are properly connected in the conversion circuit.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A ΔΣ analog-to-digital convertor comprising:
first and second amplifiers, each comprising an inverting input terminal, a non-inverting input terminal, and an output terminal;
an input node;
first to fourth capacitors;
a comparator that generates an output logical value based on a conversion voltage generated according to a charge amount accumulated in the fourth capacitor;
a first switch connected between the input node and the inverting input terminal of the first amplifier, the first switch being configured to switch between a conductive state and a cut-off state;
a second switch connected between the input node and the output terminal of the first amplifier, the second switch being configured to switch between a conductive state and a cut-off state;
a third switch connected between the input node and one end of the first capacitor, the third switch being configured to switch between a conductive state and a cut-off state;
a fourth switch connected between another end of the first capacitor and a first reference voltage node, the fourth switch being configured to switch between a conductive state and a cut-off state, and a first reference voltage being supplied through the first reference voltage node;
a fifth switch connected between one end of the second capacitor and the inverting input terminal of the second amplifier, the fifth switch being configured to switch between a conductive state and a cut-off state;
a sixth switch connected between another end of the second capacitor and the output terminal of the second amplifier, the sixth switch being configured to switch between a conductive state and a cut-off state;
a seventh switch connected between one end of the third capacitor and the output terminal of the second amplifier, the seventh switch being configured to switch between a conductive state and a cut-off state;
an eighth switch connected between another end of the third capacitor and the first reference voltage node, the eighth switch being configured to switch between a conductive state and a cut-off state;
a ninth switch connected between one end of the fourth capacitor and the first reference voltage node, the ninth switch being configured to switch between a conductive state and a cut-off state;
a tenth switch connected between the another end of the first capacitor and the inverting input terminal of the first amplifier, the tenth switch being configured to switch between a conductive state and a cut-off state;
an eleventh switch connected between the inverting input terminal of the first amplifier and the one end of the second capacitor, the eleventh switch being configured to switch between a conductive state and a cut-off state;

a twelfth switch connected between the another end of the second capacitor and the output terminal of the first amplifier, the twelfth switch being configured to switch between a conductive state and a cut-off state;

a thirteenth switch connected between the another end of the third capacitor and the inverting input terminal of the second amplifier, the thirteenth switch being configured to switch between a conductive state and a cut-off state;

a fourteenth switch connected between the inverting input terminal of the second amplifier and the one end of the fourth capacitor, the fourteenth switch being configured to switch between a conductive state and a cut-off state;

a fifteenth switch connected between another end of the fourth capacitor and the output terminal of the second amplifier, the fifteenth switch being configured to switch between a conductive state and a cut-off state;

the sixteenth switch connected between either the third or the forth voltage node and one end of the first capacitor, or connected between neither the third nor the forth voltage node and one end of the first capacitor, and a third reference voltage being supplied through the third reference voltage node and a fourth reference voltage being supplied through the fourth reference voltage node; and the seventeenth switch connected between either the third or the forth voltage node and one end of the third capacitor, or connected between neither the third nor the forth voltage node and one end of the third capacitor, and a third reference voltage being supplied through the third reference voltage node and a fourth reference voltage being supplied through the fourth reference voltage node.

2. The $\Delta\Sigma$ analog-to-digital convertor according to claim 1, further comprising a control circuit that outputs first to third control signals, wherein the control circuit:

in a first operating mode, brings the first to ninth switches into a conductive state and brings the tenth to fifteenth switches into a cut-off state by using the first and second control signals;

in a second operating mode, brings the first to ninth switches into a cut-off state and brings the tenth to fifteenth switches into a conductive state by using the first and second control signals; and in the first operating mode, brings the sixteenth to seventeenth switches into a cut-off state by using the third control signal.

3. The $\Delta\Sigma$ analog-to-digital convertor according to claim 2, wherein the sixteenth switch comprises:

a first low-potential side switch that switches whether the third reference voltage is supplied to the one end of the first capacitor or not; and a first high-potential side switch that switches whether the fourth reference voltage is supplied to the one end of the first capacitor or not, the seventeenth switch comprises:

a second low-potential side switch that switches whether the third reference voltage is supplied to the one end of the first capacitor or not; and a second high-potential side switch that switches whether the fourth reference voltage is supplied to the one end of the first capacitor or not, and the control circuit controls, according to the output logical value, the first low-potential side switch and the first high-potential side switch in an exclusive manner, and the second low-potential side switch and the second high-potential side switch in an exclusive manner.

4. The $\Delta\Sigma$ analog-to-digital convertor according to claim 1, wherein the input node comprises first and second resistors, an input voltage being input to one end of the first resistor, and another end of the first resistor being connected to one end of the second resistor, the first switch is connected between a connection point of the first and second resistors and the inverting input terminal of the first amplifier, and switches between a conductive state and a cut-off state, and the second switch is connected between another end of the second resistor and the output terminal of the first amplifier, switches between a conductive state and a cut-off state.

5. The $\Delta\Sigma$ analog-to-digital convertor according to claim 1, wherein the first reference voltage is supplied to the non-inverting terminals of the first and second amplifiers.

6. The $\Delta\Sigma$ analog-to-digital convertor according to claim 1, wherein the first amplifier has a higher current output capability than that of the second amplifier.

7. The $\Delta\Sigma$ analog-to-digital convertor according to claim 1, further comprising:

a reversed-phase side input node;

first to fourth reversed-phase side capacitors;

a first reversed-phase side switch connected between the reversed-phase side input node and the non-inverting input terminal of the first amplifier, the first reversed-phase side switch being configured to switch between a conductive state and a cut-off state;

a second reversed-phase side switch connected between the reversed-phase side input node and the output terminal of the first amplifier, the second reversed-phase side switch being configured to switch between a conductive state and a cut-off state;

a third reversed-phase side switch connected between the reversed-phase side input node and one end of the first reversed-phase side capacitor, the third reversed-phase side switch being configured to switch between a conductive state and a cut-off state;

a fourth reversed-phase side switch connected between another end of the first reversed-phase side capacitor and a first reference voltage node, the fourth reversed-phase side switch being configured to switch between a conductive state and a cut-off state, and a first reference voltage being supplied through the first reference voltage node;

a fifth reversed-phase side switch connected between one end of the second reversed-phase side capacitor and the non-inverting input terminal of the second amplifier, the fifth reversed-phase side switch being configured to switch between a conductive state and a cut-off state;

a sixth reversed-phase side switch connected between another end of the second reversed-phase side capacitor and the output terminal of the second amplifier, the sixth reversed-phase side switch being configured to switch between a conductive state and a cut-off state;

a seventh reversed-phase side switch connected between one end of the third reversed-phase side capacitor and the output terminal of the second amplifier, the seventh reversed-phase side switch being configured to switch between a conductive state and a cut-off state;

an eighth reversed-phase side switch connected between another end of the third reversed-phase side capacitor and the first reference voltage node, the eighth reversed-phase side switch being configured to switch between a conductive state and a cut-off state;

a ninth reversed-phase side switch connected between one end of the fourth reversed-phase side capacitor and the first reference voltage node, the ninth reversed-phase side switch being configured to switch between a conductive state and a cut-off state;

a tenth reversed-phase side switch connected between the another end of the first reversed-phase side capacitor and the non-inverting input terminal of the first amplifier, the tenth reversed-phase side switch being configured to switch between a conductive state and a cut-off state;

an eleventh reversed-phase side switch connected between the non-inverting input terminal of the first amplifier and the one end of the second reversed-phase side capacitor, the eleventh reversed-phase side switch being configured to switch between a conductive state and a cut-off state;

a twelfth reversed-phase side switch connected between the another end of the second reversed-phase side capacitor and the output terminal of the first amplifier, the twelfth reversed-phase side switch being configured to switch between a conductive state and a cut-off state;

a thirteenth reversed-phase side switch connected between the another end of the third reversed-phase side capacitor and the non-inverting input terminal of the second amplifier, the thirteenth reversed-phase side switch being configured to switch between a conductive state and a cut-off state;

a fourteenth reversed-phase side switch connected between the non-inverting input terminal of the second amplifier and the one end of the fourth reversed-phase side capacitor, the fourteenth reversed-phase side switch being configured to switch between a conductive state and a cut-off state;

a fifteenth reversed-phase side switch connected between another end of the fourth reversed-phase side capacitor and the output terminal of the second amplifier, the fifteenth reversed-phase side switch being configured to switch between a conductive state and a cut-off state;

the sixteenth reversed-phase side switch connected between either the third or the forth voltage node and one end of the first reversed-phase side capacitor, or connected between neither the third nor the forth voltage node and one end of the first reversed-phase side capacitor, and a third reference voltage being supplied through the third reference voltage node and a fourth reference voltage being supplied through the fourth reference voltage node; and the seventeenth reversed-phase side switch connected between either the third or the forth voltage node and one end of the third reversed-phase side capacitor, or connected between neither the third nor the forth voltage node and one end of the third capacitor, and a third reference voltage being supplied through the third reference voltage node and a fourth reference voltage being supplied through the fourth reference voltage node.

8. The ΔΣ analog-to-digital convertor according to claim 7, further comprising a control circuit that outputs first to third control signals, wherein the control circuit:

in a first operating mode, brings the first to ninth switches and the first to ninth reversed-phase side switches into a conductive state and brings the tenth to fifteenth switches and the tenth to fifteenth reversed-phase side switches into a cut-off state by using the first and second control signals;

in a second operating mode, brings the first to ninth switches and the first to ninth reversed-phase side switches into a cut-off state and brings the tenth to fifteenth switches and the tenth to fifteenth reversed-phase side switches into a conductive state by using the first and second control signals; and in the first operating mode, brings the sixteenth to seventeenth reversed-phase side switches into a cut-off state by using the third control signal.

9. The ΔΣ analog-to-digital convertor according to claim 8, wherein the sixteenth switch comprises:
a first low-potential side switch that switches whether the third reference voltage is supplied to the one end of the first capacitor or not; and
a first high-potential side switch that switches whether the fourth reference voltage is supplied to the one end of the first capacitor or not, the sixteenth reversed-phase side switch comprises:
a third low-potential side switch that switches whether the third reference voltage is supplied to the one end of the first capacitor or not; and
a third high-potential side switch that switches whether the fourth reference voltage is supplied to the one end of the first capacitor or not, the seventeenth switch comprises:
a second low-potential side switch that switches whether the third reference voltage is supplied to the one end of the first capacitor or not; and
a second high-potential side switch that switches whether the fourth reference voltage is supplied to the one end of the first capacitor or not, the seventeenth reversed-phase side switch comprises:
a fourth low-potential side switch that switches whether the third reference voltage is supplied to the one end of the first capacitor or not; and
a fourth high-potential side switch that switches whether the fourth reference voltage is supplied to the one end of the first capacitor or not, and the control circuit controls, according to the output logical value, the first and third low-potential side switches and the first and third high-potential side switches in an exclusive manner, and the second and fourth low-potential side switches and the second and fourth high-potential side switches in an exclusive manner.

10. The ΔΣ analog-to-digital convertor according to claim 7, wherein the input node comprises first and second resistors, an input voltage being input to one end of the first resistor, and another end of the first resistor being connected to one end of the second resistor, the reversed-phase side input node comprises third and fourth resistors, a reversed-phase side input voltage being input to one end of the third resistor, and another end of the third resistor being connected to one end of the fourth resistor, the first switch is connected between a connection point of the first and second resistors and the inverting input terminal of the first amplifier, and switches between a conductive state and a cut-off state, the second switch is connected between another end of the second resistor and the output terminal of the first amplifier, and switches between a conductive state and a cut-off state, the first reversed-phase side switch is connected between a connection point of the third and fourth resistors and the non-inverting input terminal of the first amplifier, and switches between a conductive state and a cut-off state, and the second reversed-phase side switch is connected between another end of the fourth resistor and the output terminal of the first amplifier, and switches between a conductive state and a cut-off state.

11. The ΔΣ analog-to-digital convertor according to claim 7, wherein the first amplifier has a higher current output capability than that of the second amplifier.

* * * * *